(12) United States Patent
Tian et al.

(10) Patent No.: US 10,566,199 B2
(45) Date of Patent: Feb. 18, 2020

(54) METHODS OF MANUFACTURING THIN FILM TRANSISTOR, ARRAY SUBSTRATE AND DISPLAY DEVICE

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Zhendong Tian, Beijing (CN); Hanrong Liu, Beijing (CN); Bing Gong, Beijing (CN); Kaifu Jia, Beijing (CN); Shuang Hu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 163 days.

(21) Appl. No.: 15/578,210

(22) PCT Filed: Jul. 12, 2017

(86) PCT No.: PCT/CN2017/092619
§ 371 (c)(1),
(2) Date: Nov. 29, 2017

(87) PCT Pub. No.: WO2018/126636
PCT Pub. Date: Jul. 12, 2018

(65) Prior Publication Data
US 2019/0221429 A1    Jul. 18, 2019

(30) Foreign Application Priority Data

Jan. 4, 2017  (CN) .......................... 2017 1 0003896

(51) Int. Cl.
*H01L 21/266* (2006.01)
*H01L 29/66* (2006.01)
(Continued)

(52) U.S. Cl.
CPC ........ *H01L 21/266* (2013.01); *H01L 27/1214* (2013.01); *H01L 27/1288* (2013.01);
(Continued)

(58) Field of Classification Search
CPC ............... H01L 21/266; H01L 27/1288; H01L 29/66757
(Continued)

(56) References Cited

U.S. PATENT DOCUMENTS

| 2004/0201067 A1* | 10/2004 | Shih ................. H01L 21/26586 257/408 |
| 2006/0160283 A1 | 7/2006 | Ting |
| 2007/0210377 A1* | 9/2007 | Seo ................... H01L 29/66598 257/335 |

FOREIGN PATENT DOCUMENTS

| CN | 1632681 A | 6/2005 |
| CN | 101840865 A | 9/2010 |

(Continued)

OTHER PUBLICATIONS

International Search Report & Box V of Written Opinion, for PCT Patent Application No. PCT/CN2017/092619, dated Oct. 13, 2017, 17 pages.

*Primary Examiner* — Elias Ullah
(74) *Attorney, Agent, or Firm* — Kinney & Lange, P.A.

(57) ABSTRACT

A method of manufacturing a thin film transistor includes forming a semiconductor layer on a base substrate; forming a gate electrode on the semiconductor layer; forming a shield on the gate electrode, wherein a perpendicular projection of the shield onto the base substrate covers a first (Continued)

source portion of the source region and a first drain portion of the drain region; and performing ion implantation to the semiconductor layer by using the shield as a mask, so as to form a first doped region in the first source portion and in the first drain portion, and to form a second doped region in a second source portion of the source region that is not covered by the perpendicular projection of the shield and in a second drain portion of the drain region that is not covered by the perpendicular projection of the shield.

15 Claims, 7 Drawing Sheets

(51) Int. Cl.
      *H01L 27/12*     (2006.01)
      *H01L 29/786*   (2006.01)

(52) U.S. Cl.
      CPC .. *H01L 29/66757* (2013.01); *H01L 29/78621* (2013.01); *H01L 29/78675* (2013.01)

(58) Field of Classification Search
      USPC .......................................................... 438/514
      See application file for complete search history.

(56) References Cited

FOREIGN PATENT DOCUMENTS

| | | |
|---|---|---|
| CN | 106653862 A | 5/2017 |
| CN | 106783626 A | 5/2017 |

* cited by examiner

US 10,566,199 B2

METHODS OF MANUFACTURING THIN FILM TRANSISTOR, ARRAY SUBSTRATE AND DISPLAY DEVICE

CROSS-REFERENCE TO RELATED APPLICATION

This application is a Section 371 National Stage Application of International Application No. PCT/CN2017/092619, filed on 12 Jul. 2017, entitled "METHODS OF MANUFACTURING THIN FILM TRANSISTOR, ARRAY SUBSTRATE AND DISPLAY DEVICE", which claim priority to Chinese Application No. 201710003896.2, filed on 4 Jan. 2017, incorporated herein by reference in its entirety.

TECHNICAL FIELD

The present disclosure relates to the field of display technology, and particularly, to a method of manufacturing a thin film transistor, a method of manufacturing an array substrate and a method of manufacturing a display device.

BACKGROUND

Thin film transistors (TFTs) are widely used in the field of display technology. A conventional method of manufacturing a thin film transistor needs at least two patterning processes to form at least two masks to perform doping processes, so as to form a lightly doped region and a heavily doped region in a source region and a drain region.

SUMMARY

Embodiment of the present disclosure provides a method of manufacturing a thin film transistor, a method of manufacturing an array substrate and a method of manufacturing a display device, which can solve problems such as complicated doping methods and processes, difficulties in controlling parameters, and high rejection rate.

An aim of the present disclosure is to provide a method of manufacturing a thin film transistor.

According to a first aspect of the present disclosure, there is provided a method of manufacturing a thin film transistor. The method of manufacturing a thin film transistor comprises: forming a semiconductor layer on a base substrate, forming a gate electrode on the semiconductor layer, and defining, in the semiconductor layer, a channel region located under the gate electrode, a source region located at a first side of the channel region and a drain region located at a second side of the channel region opposite to the first side, wherein the method further comprises:

forming a shield on the gate electrode, a perpendicular projection of the shield onto the base substrate covering a first source portion of the source region and a first drain portion of the drain region; and performing ion implantation to the semiconductor layer by using the shield as a mask, so as to form a first doped region in the first source portion and in the first drain portion, and to form a second doped region in a second source portion of the source region that is not covered by the perpendicular projection of the shield and in a second drain portion of the drain region that is not covered by the perpendicular projection of the shield.

In an embodiment, the ion implantation comprises at least one perpendicular ion implantation, at least one first inclined ion implantation and at least one second inclined ion implantation, wherein a direction of the first inclined ion implantation is inclined towards the first side of the channel region, and a direction of the second inclined ion implantation is inclined towards the second side of the channel region.

In an embodiment, the perpendicular ion implantation is a heavy-doping ion implantation, the first inclined ion implantation and the second inclined ion implantation are light-doping ion implantation.

In an embodiment, the shield comprises photoresist.

In an embodiment, forming the gate electrode on the semiconductor layer and forming the shield on the gate electrode comprises:

forming, on the semiconductor layer, an electrically conductive layer for forming the gate electrode;

forming a photoresist base layer on the electrically conductive layer;

patterning the photoresist base layer to form the shield; and overetching the electrically conductive layer by using the shield as a mask, such that the electrically conductive layer is recessed inwardly from an outer edge of the patterned photoresist, so as to form the gate electrode.

In an embodiment, the method further comprises: forming a gate insulation layer on the semiconductor layer before forming the gate electrode.

In an embodiment, the method further comprises: controlling a compactness of the gate insulation layer to adjust a threshold voltage while forming the gate insulation layer.

In an embodiment, controlling the compactness of the gate insulation layer comprises: controlling, while forming the gate insulation layer, at least one of the following parameters: a mixing ratio of process gases, a film formation rate, a reaction temperature, a power of plasma and a film thickness.

In an embodiment, the method further comprises: forming a buffer layer on the base substrate, before forming the semiconductor layer.

In an embodiment, a material of the semiconductor layer comprises polycrystalline silicon.

In an embodiment, each of the first doped region and the second doped region is n-doped.

In an embodiment, doping ions include phosphorus.

In an embodiment, a doping concentration of phosphorus in the first doped region is in a range from about $1\times10^{13}$ to about $5\times10^{13}$ cm$^{-3}$, and a doping concentration of phosphorus in the second doped region is in a range from about $3\times10^{13}$ to about $9\times10^{14}$ cm$^{-3}$.

Another aim of the present disclosure is to provide a method of manufacturing an array substrate.

According to a second aspect of the present disclosure, there is provided a method of manufacturing a thin film transistor. The method of manufacturing the array substrate comprises the method of manufacturing the thin film transistor described as above.

A further aim of the present disclosure is to provide a method of manufacturing a display device.

According to a third aspect of the present disclosure, there is provided a method of manufacturing a display device. The method of manufacturing the display device comprises the method of manufacturing the array substrate described as above.

BRIEF DESCRIPTION OF THE DRAWINGS

In order to describe the technical solutions in embodiments of the present disclosure more clearly, a brief introduction to the appended drawings showing the embodiments is provided as follows. It should be understood, however, the appended drawings described below only relate to some embodiments of the present disclosure, and they should not be interpreted as limitations to the present disclosure, wherein.

DETAILED DESCRIPTION OF EMBODIMENTS

In order to make aims, technical solutions and advantages of the embodiments of the present disclosure more apparent, the embodiments of the present disclosure will be described clearly and fully hereinafter with reference to the attached drawings. Apparently, only some, not all, of the embodiments of the present disclosure are described. All other embodiments that can be obtained by an ordinary skilled in the art on the basis of the described embodiments of the present disclosure without a creative work shall also fall within the scope of the present disclosure.

When introducing elements of the present disclosure and its embodiments, the singular form of a word used in the description and claims is intended to include the plural form thereof, and vice versa, unless the context clearly indicates otherwise. Therefore, when a singular is mentioned, it usually includes a plural. Terms "comprise", "include", "contain" and "have" are intended as inclusive and indicate that there may be elements other than those have been listed exist. Unless clearly noted otherwise, the singular form of a word used in the description and claims is intended to include the plural form thereof, and vice versa. Therefore, when a singular is mentioned, it usually includes a plural. Similarly, terms "comprise" and "include" should be interpreted as inclusive instead of exclusive. Similarly, terms "comprise" and "or" should be interpreted as inclusive, unless the context clearly excludes such interpretation. Wherever a term "example" is used in the present disclosure, especially when the term is used after a set of terms, the "example" is only exemplary and illustrative, and should not be interpreted as being exclusive or extensive.

Hereinafter, for the purpose of description, terms "up", "down", "left", "right", "vertical", "horizontal", "top", "bottom" and their derivations used in the present disclosure mean to indicate direction as shown in the appended drawings. Terms "cover", "on the top of . . . ", "located on . . . " or "located on the top of . . . " mean that a first element such as a first structure exists on a second element such as a second structure, wherein there may be an intermediate element, such as an interface structure, existing between the first structure and the second structure. Term "contact" means that the first element such as the first structure and the second element such as the second structure are connected, and there may be another or no element existing at the interface between the two elements.

Figure 1:
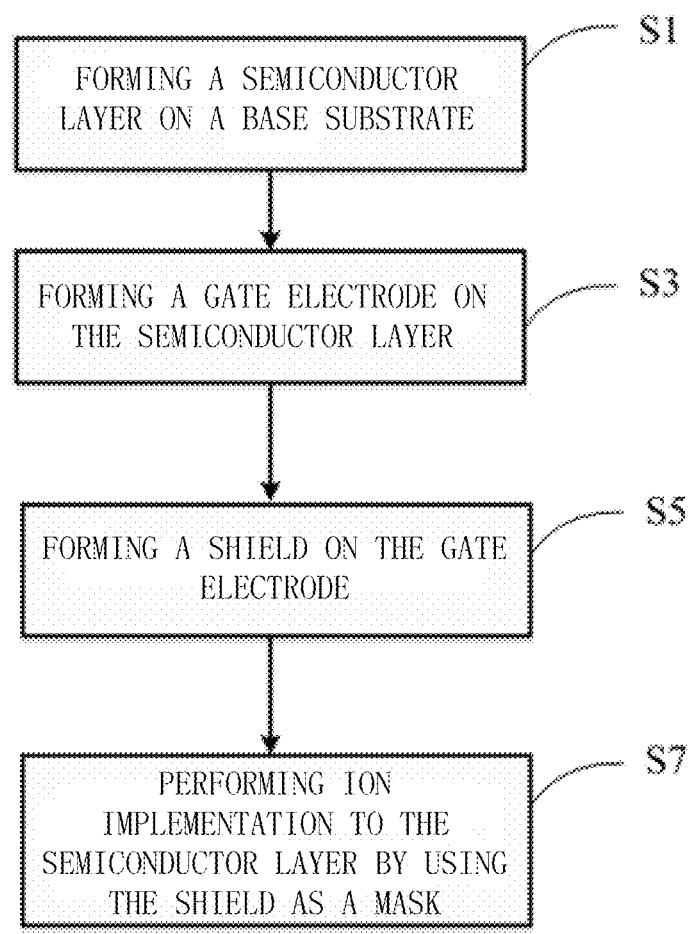
FIG. 1 is a flow chart of a method of manufacturing a thin film transistor according to an embodiment of the present disclosure.

FIG. 1 is a flow chart of a method of manufacturing a thin film transistor according to an embodiment of the present disclosure. As shown in FIG. 1, in an embodiment, the method of manufacturing a thin film transistor includes:

S1: forming a semiconductor layer on a base substrate;

S3: forming a gate electrode on the semiconductor layer, and defining a channel region, which is located underneath the gate electrode, in the semiconductor layer, a source region located at a first side of the channel region, and a drain region located at a second side of the channel region opposite to the first side;

S5: forming a shield on the gate electrode, a perpendicular projection of the shield onto the base substrate covering a first source portion of the source region and a first drain portion of the drain region; and S7: performing ion implantation to the semiconductor layer, using the shield as a mask, so as to form a first doped region in the first source portion and the first drain portion, and to form a second doped region in a second source portion of the source region that is not covered by the perpendicular projection of the shield and in a second drain portion of the drain region that is not covered by the perpendicular projection of the shield.

By forming the shield on the gate electrode such that the perpendicular projection of the shield onto the base substrate covers the first source portion of the source region and the first drain portion of the drain region, and by performing ion implantation to the semiconductor layer, using the shield as a mask, to form the first doped region in the first source portion and the first drain portion and to form the second doped region in the second source portion of the source region that is not covered by the perpendicular projection of the shield and in the second drain portion of the drain region that is not covered by the perpendicular projection of the shield, the shield can be utilized as a mask to form the first doped region and the second doped region in the semiconductor layer, such that no more mask is need, and the number of patterning processes can be reduced. This method may simplify manufacturing process, reduce time spent on the manufacture, improve product yield rate, and reduce manufacturing cost.

In an embodiment, performing ion implantation may include at least one perpendicular heavy-doping ion implantation and at least two inclined light-doping ion implantations.

The base substrate may include at least one of a glass substrate, a quartz substrate and an organic resin substrate. The shield may include photoresist, and in this case, the method of manufacturing the thin film transistor may further include removing the photoresist after performing the ion implantation.

In an embodiment, before forming the gate electrode, the method of manufacturing the thin film transistor may further include forming a gate insulation layer on the semiconductor layer. The method may further include forming a buffer layer, before forming the semiconductor layer. A material of the buffer layer may include at least one of silicon nitride ($SiN_x$), silicon oxide ($SiO_x$) and silicon oxynitride ($SiN_xO_y$).

FIGS. 2(a) to 2(d) are illustrative drawings, showing a method of manufacturing a thin film transistor according to an embodiment of the present disclosure.

Figure 2A:
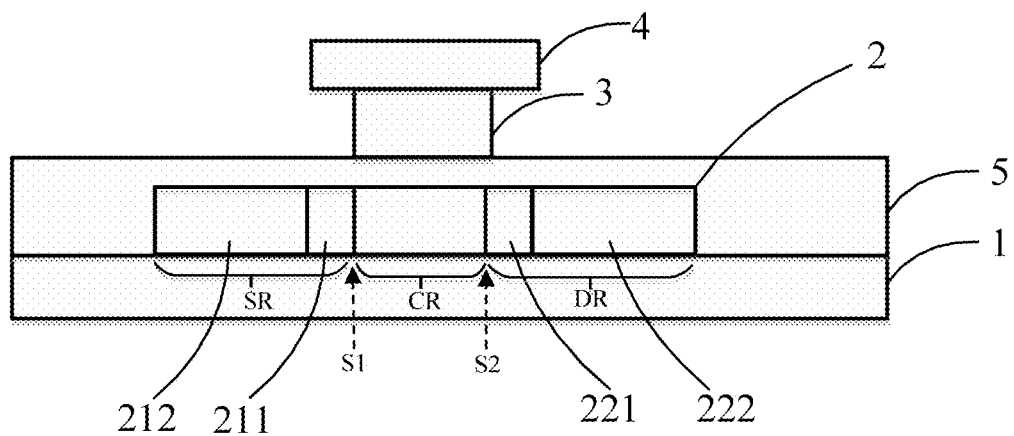
FIGS. 2(a) to 2(d) are illustrative drawings, showing a method of manufacturing a thin film transistor according to an embodiment of the present disclosure.
Figure 2B:
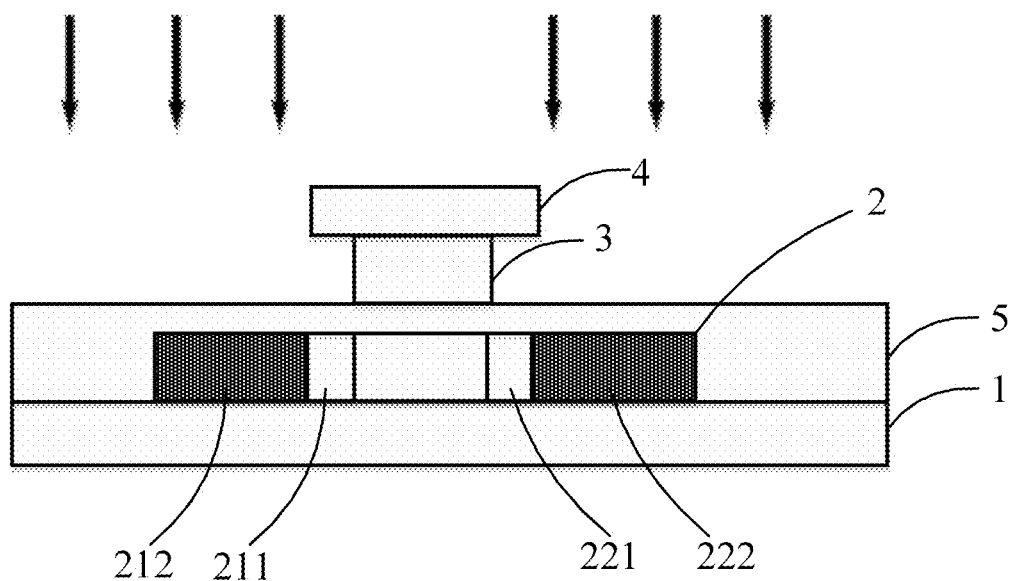
Figure 2C:
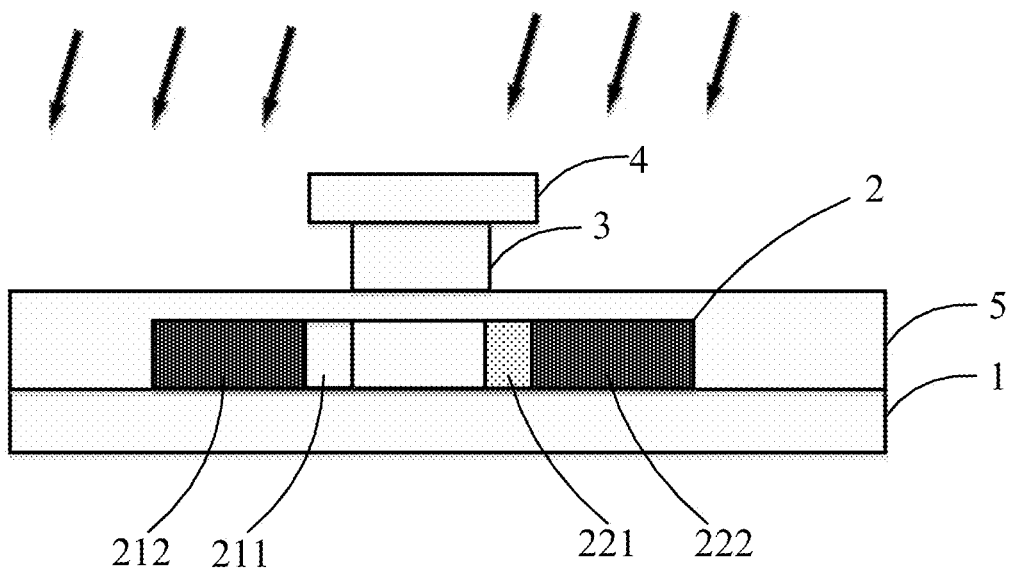
Figure 2D:
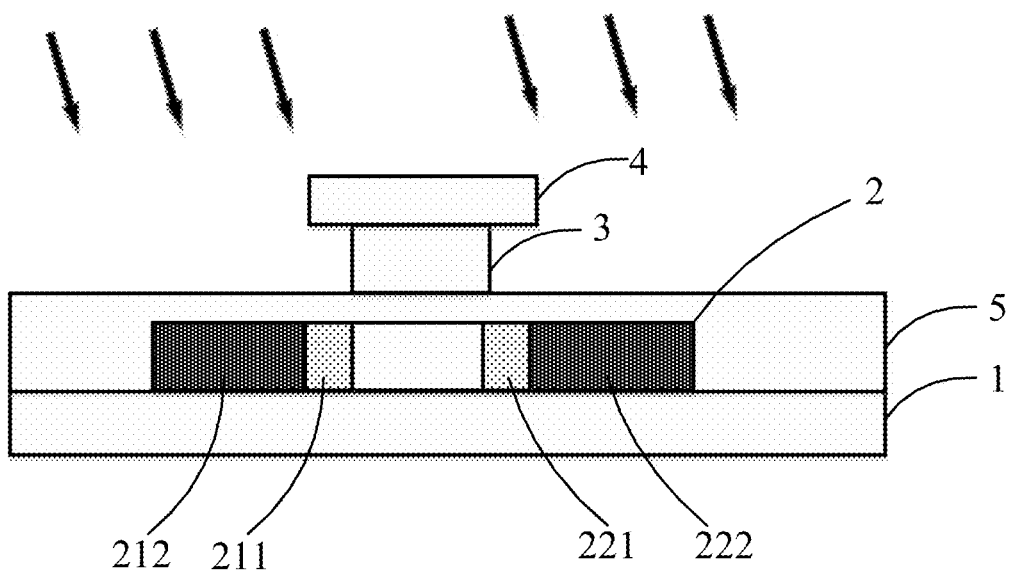

As shown in FIG. 2(a), a semiconductor layer 2 is formed on a base substrate 1, a gate electrode 3 is formed on the semiconductor layer 2, and the semiconductor layer 2 includes a channel region CR located under the gate electrode 3, a source region SR located at a first side S1 of the channel region and a drain region DR located at a second side S2 of the channel region CR opposite to the first side S1. A shield 4 is formed on the gate electrode 3. The perpendicular projection of the shield 4 on the base substrate 1 covers a first source portion 211 (which is adjacent to the gate electrode in a transverse direction) of the source region and a first drain portion 221 (which is adjacent to the gate electrode in a transverse direction) of the drain region. It can be seen from FIG. 2(*a*) that the shield 4 has protrusions at both sides of the gate electrode and the shield does not extend to the bottom of the gate electrode, the shield does not contact the bottom of the gate electrode and does not contact the gate insulation layer 5 located between the gate electrode 3 and the semiconductor layer 2.

In an embodiment, as will be described hereinafter, a pattern of the gate electrode 3 may be formed for example by overetching such as wet etching, such that after the overetching, a perpendicular projection of the gate electrode on the base substrate falls within the perpendicular projection of the shield on the base substrate, and the projection of the gate electrode on the base substrate does not coincide with the projection of the shield on the base substrate.

As shown in FIG. 2(*b*), the shield 4, such as photoresist, is used as the mask for performing the perpendicular ion implantation (indicated by arrows in FIG. 2(*b*)). In a case that the second doped regions (i.e., the second source portion 212 and the second drain portion 222) are configured as heavily doped regions, the perpendicular ion implantation is a heavy-doping ion implantation. Material, energy and dose for the ion implantation may be set according to practical requirements. Since the perpendicular projection of the shield 4 on the base substrate 1 covers the first source portion 211 of the source region and the first drain portion 221 of the drain region, the perpendicular ion implantation may form heavily doped regions in the second source portion 212 of the source region that is not covered by the perpendicular projection of the shield on the base substrate and in the second drain portion 222 of the drain region that is not covered by the perpendicular projection of the shield on the base substrate, while the first source portion 211 and the first drain portion 221 located directly below the shield are not heavily doped.

As shown in FIG. 2(*c*), the shield 4, such as photoresist, is used as the mask for performing at least one first inclined ion implantation (indicated by arrows in FIG. 2(*c*)). In a case that the first doped regions (i.e., the first source portion 211 and the first drain portion 221) are configured as lightly doped regions, the first inclined ion implantation is a light-doping ion implantation. Material, energy and dose for the ion implantation may be set according to practical requirements. As shown in FIG. 2(*c*), a direction of the first inclined ion implantation is set to incline towards the first side of the channel region, and with this inclined ion implantation, a lightly doped region can be formed in the first drain portion 221. At this time, however, due to the shielding from the shield 4 and the gate electrode 3, no lightly doped region is formed in the first source portion 211.

As shown in FIG. 2(*d*), at least one second inclined ion implantation (indicated by arrows in FIG. 2(*d*)) is performed. It can be seen that a direction of the second inclined ion implantation is set to incline towards second side of the channel region. In a case that the first doped regions (i.e., the first source portion 211 and the first drain portion 221) are configured as lightly doped regions, the second inclined ion implantation is a light-doping ion implantation. Material, energy and dose for the ion implantation may be set according to practical requirements. With the ion implantation shown in FIG. 2(*d*), a lightly doped region can be formed in the first drain portion 221.

Therefore, with the method shown in FIGS. 2(*a*) to 2(*d*), the first doped region and the second doped region can be formed in the semiconductor layer only by using the shield 4 as the mask, and no more mask is needed, such that problems such as complicated conventional doping method, difficulties in controlling parameters and high rejection rate can be avoided.

To be noted, an order of performing the perpendicular ion implantation, the first inclined ion implantation and the second inclined ion implantation is not specifically required.

Figure 3A:
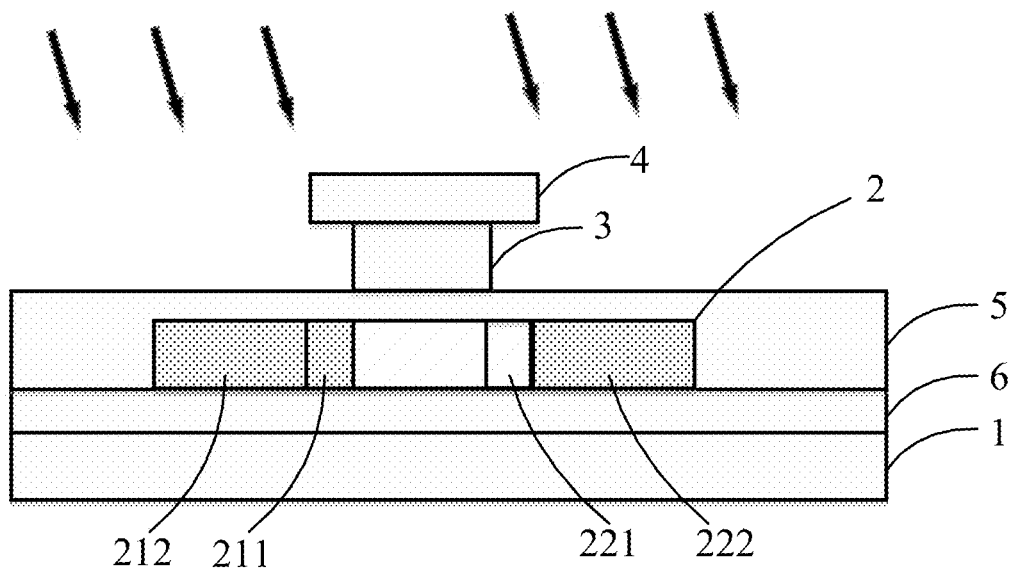
FIGS. 3(a) to 3(c) are illustrative drawings, showing a method of manufacturing a thin film transistor according to an embodiment of the present disclosure.
Figure 3B:
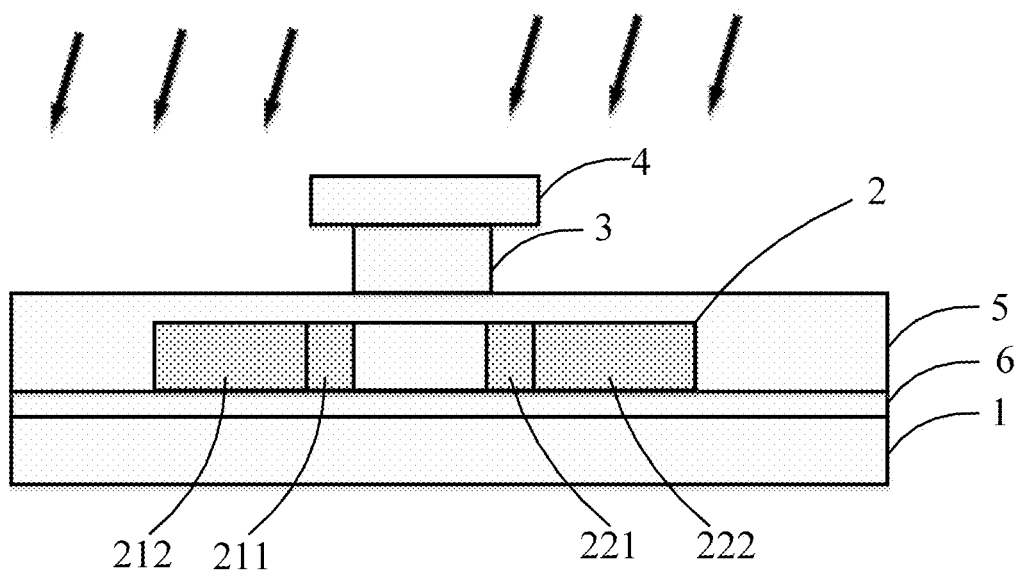
Figure 3C:
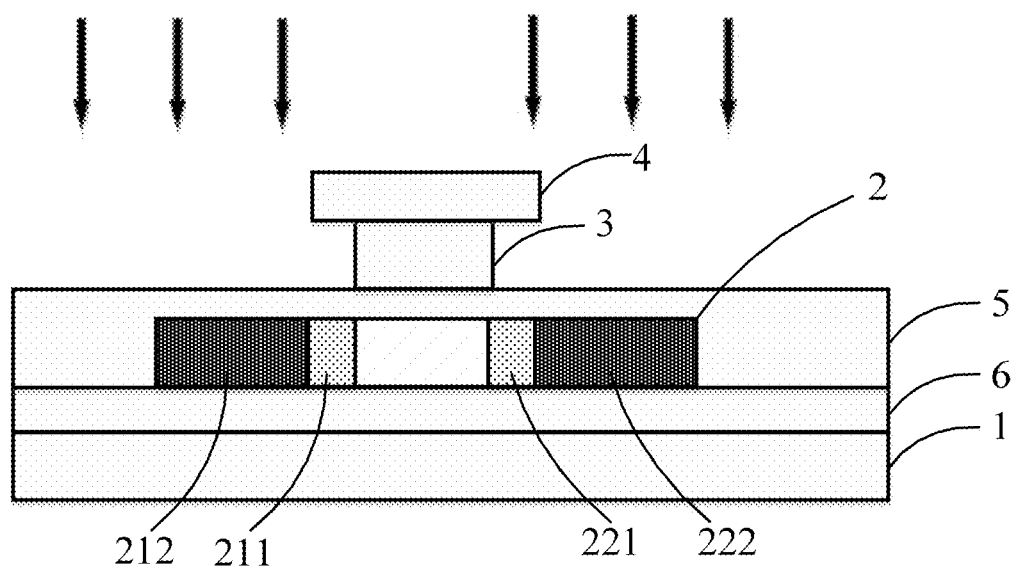

FIGS. 3(*a*) to 3(*c*) are illustrative drawings, showing a method of manufacturing a thin film transistor according to an embodiment of the present disclosure. Description of structures indicated by same or similar reference numerals in FIGS. 2 and 3 will not be repeated herein. Differences between the structure shown in FIGS. 3(*a*) to 3(*c*) and the structure shown in FIGS. 2(*a*) to 2(*d*) lie in that the method of manufacturing the thin film transistor shown in FIGS. 3(*a*) to 3(*c*) further comprises forming a buffer layer 6 on the base substrate 1 and lie in the sequence of performing the three ion implantation processes.

As shown in FIG. 3(*a*), the shield 4, such as photoresist, is used as the mask for performing the second inclined ion implantation (indicated by arrows in FIG. 3(*a*)) toward the second side of the channel region. In a case that the first doped regions (i.e., the first source portion 211 and the first drain portion 221) are configured as lightly doped regions, the second inclined ion implantation is a light-doping ion implantation. Material, energy and dose for the ion implantation may be set according to practical requirements. With the inclined ion implantation shown in FIG. 3(*a*), a lightly doped region may be formed in the first source portion 211. At this time, however, due to the shielding from the shield 4 and the gate electrode 3, no lightly doped region is formed in the first drain portion 221.

As shown in FIG. 3(*b*), the first inclined ion implantation (indicated by arrows in FIG. 3(*b*)) towards the first side of the channel region is performed. In a case that the first doped regions (i.e., the first source portion 211 and the first drain portion 221) are configured as a lightly doped regions, the first inclined ion implantation is a light doping ion implantation. Material, energy and dose for the ion implantation may be set according to practical requirements. As shown in FIG. 3(*b*), a lightly doped region is formed in the first drain portion 221 by the first inclined ion implantation.

As shown in FIG. 3(*c*), a perpendicular ion implantation (indicated by arrows in FIG. 3(*c*)) is performed. In a case that the second doped regions (i.e., the second source portion 212 and the second drain portion 222) are configured as heavily doped regions, the perpendicular ion implantation is a heavy doping ion implantation. Material, energy and dose for the ion implantation may be set according to practical requirements. Since the perpendicular projection of the shield 4 on base substrate 1 covers the first source portion 211 of the source region and the first drain portion 221 of the drain region, the perpendicular ion implantation may form heavily doped regions in the second source portion 212 of the source region and the second drain portion 222 of the drain region that are not covered by the perpendicular projection of the shield on the base substrate, while the first source portion 211 and the first drain portion 221 directly below the shield are not heavily doped.

By adjusting a carrier carrying the thin film transistor, a certain angle may be formed between the thin film transistor and a source of the ion implantation, such that the inclined ion implantation can be performed. Alternatively, a certain angle may be formed between a plasma beam emitted by the source of the ion implantation and the thin film transistor by adjusting an intensity of magnetic field for the ion implantation to perform the inclined ion implantation.

A material of the semiconductor layer may comprise polycrystalline silicon. Each of the first doped region and the second doped region may be n-doped. Doping ions may include phosphorus. A doping concentration of phosphorus in the first doped region may be in a range from about $1 \times 10^{13}$ to about $5 \times 10^{13}$ cm$^{-3}$, and a doping concentration of phosphorus in the second doped region may be in a range from about $3 \times 10^{13}$ to about $9 \times 10^{14}$ cm$^{-3}$.

In an embodiment, the method of manufacturing the thin film transistor may further comprise controlling the compactness of the gate insulation layer to adjust a threshold voltage while forming the gate insulation layer. A plasma enhanced chemical vapor deposition (PECVD) process may be utilized to deposit the gate insulation layer. Controlling the compactness of the gate insulation layer may comprises controlling, while forming the gate insulation layer, at least one of the following parameters: a mixing ratio of process gases, a film formation rate, a reaction temperature, a power of plasma, a film thickness and the like.

In an embodiment, a material of the shield may include photoresist. In this circumstance, forming the gate electrode on the semiconductor layer and forming the shield on the gate electrode may comprise the following steps:

S31: forming, on the semiconductor layer, an electrically conductive layer for forming the gate electrode;

S51: forming a photoresist base layer on the electrically conductive layer;

S53: patterning the photoresist base layer to form the shield; and

S33: overetching the electrically conductive layer by using the shield as a mask, such that the electrically conductive layer is recessed inwardly from an outer edge of the patterned photoresist, so as to form the gate electrode.

FIGS. 4(a) to 4(d) are illustrative drawings, showing a method of forming the gate electrode and the shield of a thin film transistor according to an embodiment of the present disclosure.

Figure 4A:
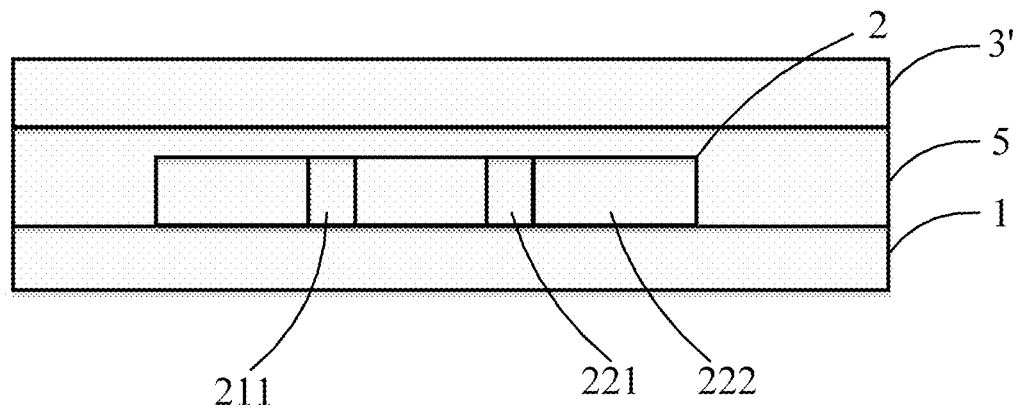
FIGS. 4(a) to 4(d) are illustrative drawings, showing a method of forming a gate electrode and a shield of a thin film transistor according to an embodiment of the present disclosure.

As shown in FIG. 4(a), a method of forming the gate electrode and the shield of the thin film transistor according to an embodiment may comprises: forming a semiconductor layer 2 on the base substrate; forming a gate insulation layer 5 on the semiconductor layer 2; and forming, on the gate insulation layer, an electrically conductive layer 3' for forming the gate electrode. A material of the electrically conductive layer 3' may include at least one of cuprum (Cu), molybdenum (Mo), niobium (Nb), aluminum (Al), neodymium (Nd), Titanium (Ti), Argentine (Ag), platinum (Pt), chromium (Cr) and wolfram (W).

Figure 4B:
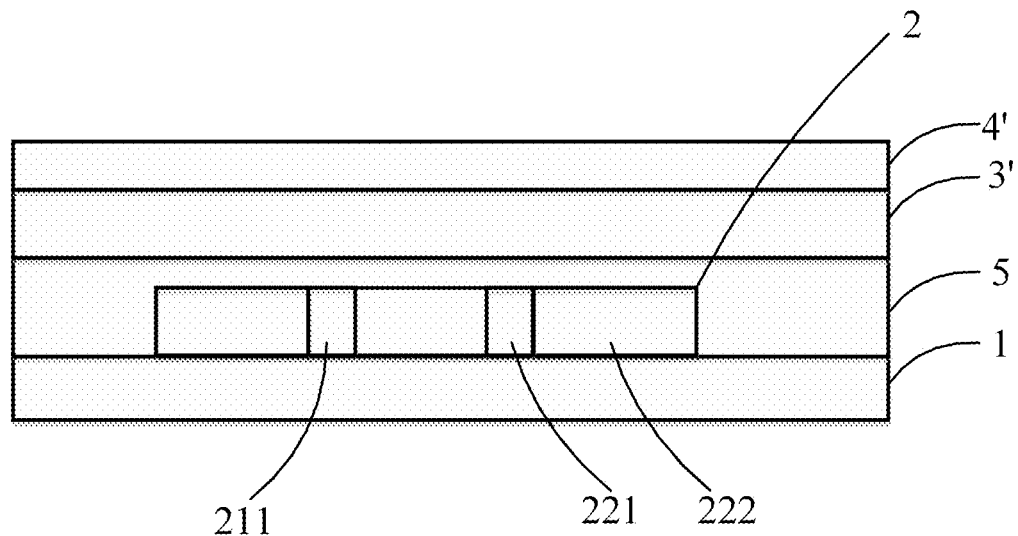

As shown in FIG. 4(b), a method of manufacturing a thin film transistor according to an embodiment may comprise forming a photoresist base layer 4' on the electrically conductive layer 3'. For example, the photoresist base layer may be formed through applying a layer of photoresist on the electrically conductive layer by using a coating machine.

Figure 4C:
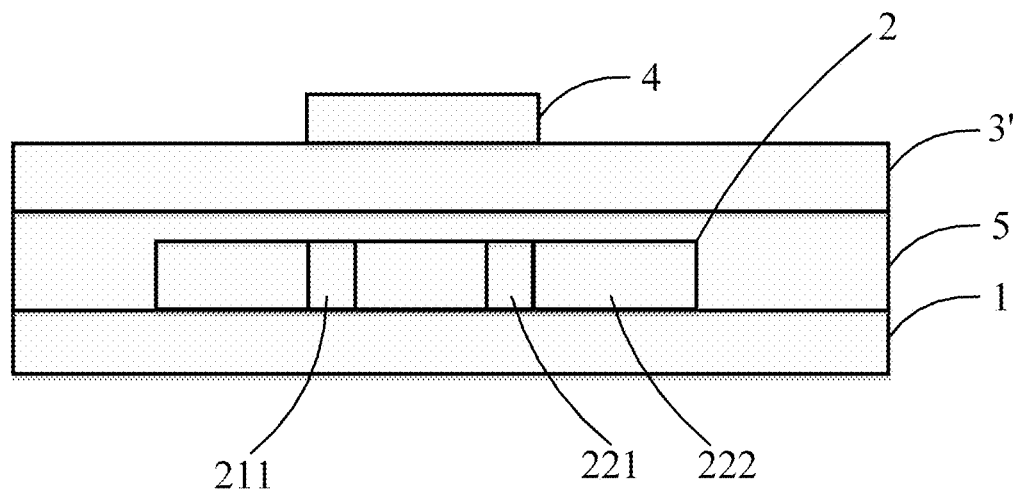

Next, as shown in FIG. 4(c), a patterning process is performed on the photoresist base layer 4' to form the shield 4. A mask may be used in the patterning process to expose and then develop the photoresist base layer, so as to obtain the shield formed from the pattern of the photoresist base layer formed after the patterning process.

Figure 4D:
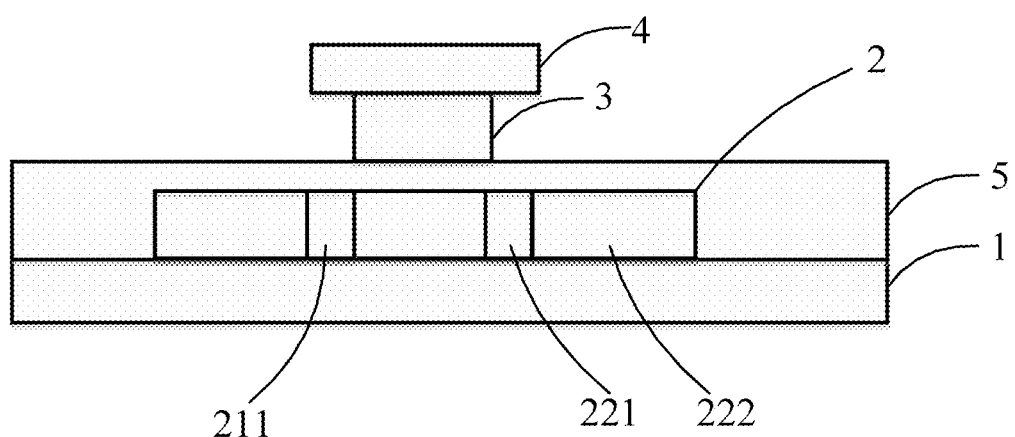

Then, as shown in FIG. 4(d), the shield 4 is used as a mask, and the electrically conductive layer 3' is overetched such that the electrically conductive layer 3' is recessed inwardly from an outer edge of the patterned photoresist, so as to form the gate electrode. A method of the overetching process may comprise a wet etching using an acid or the like.

Embodiments of the present disclosure further provide a method of manufacturing an array substrate and a method of manufacturing a display device. The array substrate in an embodiment of the present disclosure comprises the thin film transistor described as above. The display device in an embodiment of the present disclosure comprises the array substrate described as above. The display device according to the embodiment of the present disclosure may be: a mobile phone, a tablet computer, a television, a notebook computer, a digital photo frame, a navigator or any other products or components having a display function.

Several specific embodiments have been described. However, these embodiments are provided by way of examples and are not intended to limit the scope of the present disclosure. In fact, various omissions, substitutions and modifications can be made to the embodiments described in the present disclosure with departing from the spirit of the disclosure. The appended claims and their equivalents are intended to cover such cases or modifications that fall within the scope and spirit of the present disclosure.

What is claimed is:

1. A method of manufacturing a thin film transistor, the method comprising:
    forming a semiconductor layer on a base substrate;
    forming a gate electrode on the semiconductor layer
    defining, in the semiconductor layer, a channel region located under the gate electrode, a source region located at a first side of the channel region and a drain region located at a second side of the channel region opposite to the first side;
    forming a shield on the gate electrode, a perpendicular projection of the shield onto the base substrate covering a first source portion of the source region and a first drain portion of the drain region; and
    performing ion implantation to the semiconductor layer by using the shield as a mask, so as to form a first doped region in the first source portion and in the first drain portion, and to form a second doped region in a second source portion of the source region that is not covered by the perpendicular projection of the shield and in a second drain portion of the drain region that is not covered by the perpendicular projection of the shield.

2. The method of manufacturing a thin film transistor according to claim 1, wherein the ion implantation comprises at least one perpendicular ion implantation, at least one first inclined ion implantation and at least one second inclined ion implantation, wherein a direction of the first inclined ion implantation is inclined towards the first side of the channel region, and a direction of the second inclined ion implantation is inclined towards the second side of the channel region.

3. The method of manufacturing a thin film transistor according to claim 2, wherein the perpendicular ion implantation is a heavy-doping ion implantation, the first inclined ion implantation and the second inclined ion implantation are light-doping ion implantation.

4. The method of manufacturing a thin film transistor according to claim 1, wherein the shield comprises photoresist.

5. The method of manufacturing a thin film transistor according to claim 4, wherein forming the gate electrode on the semiconductor layer and forming the shield on the gate electrode comprises:
    forming, on the semiconductor layer, an electrically conductive layer for forming the gate electrode;

forming a photoresist base layer on the electrically conductive layer;
patterning the photoresist base layer to form the shield; and
overetching the electrically conductive layer by using the shield as a mask, such that the electrically conductive layer is recessed inwardly from an outer edge of the patterned photoresist, so as to form the gate electrode.

6. The method of manufacturing a thin film transistor according to claim 1, wherein the method further comprises: forming a gate insulation layer on the semiconductor layer before forming the gate electrode.

7. The method of manufacturing a thin film transistor according to claim 6, wherein the method further comprises: controlling a compactness of the gate insulation layer to adjust a threshold voltage while forming the gate insulation layer.

8. The method of manufacturing a thin film transistor according to claim 7, wherein controlling the compactness of the gate insulation layer comprises: controlling, while forming the gate insulation layer, at least one of the following parameters: a mixing ratio of process gases, a film formation rate, a reaction temperature, a power of plasma and a film thickness.

9. The method of manufacturing a thin film transistor according to claim 1, wherein the method further comprises: forming a buffer layer on the base substrate, before forming the semiconductor layer.

10. The method of manufacturing a thin film transistor according to claim 1, wherein a material of the semiconductor layer comprises polycrystalline silicon.

11. The method of manufacturing a thin film transistor according to claim 1, wherein each of the first doped region and the second doped region is n-doped.

12. The method of manufacturing a thin film transistor according to claim 10, wherein doping ions include phosphorus.

13. The method of manufacturing a thin film transistor according to claim 12, wherein a doping concentration of phosphorus in the first doped region is in a range from about $1\times10^{13}$ to about $5\times10^{13}$ $cm^{-3}$, and a doping concentration of phosphorus in the second doped region is in a range from about $3\times10^{13}$ to about $9\times10^{14}$ $cm^{-3}$.

14. A method of manufacturing an array substrate, wherein the method of manufacturing the array substrate comprises the method of manufacturing the thin film transistor according to claim 1.

15. A method of manufacturing a display device, wherein the method of manufacturing the display device comprises the method of manufacturing the array substrate according to claim 14.

* * * * *